(12) United States Patent
Alwardi

(10) Patent No.: US 6,768,951 B2
(45) Date of Patent: Jul. 27, 2004

(54) APPARATUS AND METHOD FOR MEASURING A PARAMETER IN A HOST DEVICE

(75) Inventor: Milad Alwardi, Allen, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/225,620

(22) Filed: Aug. 22, 2002

(65) Prior Publication Data
US 2004/0039538 A1 Feb. 26, 2004

(51) Int. Cl.⁷ .............................................. G06F 19/00
(52) U.S. Cl. ............................ 702/63; 702/62; 702/81; 702/182
(58) Field of Search ............................ 702/60–62, 63, 702/64, 65, 81, 124, 125, 126, 182, 186; 320/121, 134, 137, 149, 152

(56) References Cited

U.S. PATENT DOCUMENTS 5,610,958 A * 3/1997 Shimano et al. ............ 376/277
5,910,660 A * 6/1999 Hodel et al. ............ 250/559.22
6,215,202 B1 * 4/2001 Luongo et al. ............... 307/64
6,501,249 B1 * 12/2002 Drori ......................... 320/149

* cited by examiner

Primary Examiner—Bryan Bui
(74) Attorney, Agent, or Firm—W. Daniel Swayze, Jr.; W. James Brady; Frederick J. Telecky, Jr.

(57) ABSTRACT

An apparatus receives an indicating signal representing a parameter at a monitoring locus and includes: (a) A first measuring unit having a first input coupled for selectively receiving the indicating signal and presenting a first output signal that includes a first monitoring signal representing change in the indicating signal during a first time interval and a first benchmark signal indicating change imparted to signals by the first measuring unit. (b) A second measuring unit having a second input coupled for selectively receiving the indicating signal and presenting a second output signal that includes a second monitoring signal representing change in the indicating signal during a second time interval and a second benchmark signal indicating change imparted to signals by the second measuring unit. (c) An accumulating and indicator unit coupled for receiving and evaluating the first and second output signals and generating an indicator signal that represents the evaluating.

20 Claims, 3 Drawing Sheets

APPARATUS AND METHOD FOR MEASURING A PARAMETER IN A HOST DEVICE

BACKGROUND OF THE INVENTION

The present invention is directed to apparatuses and methods for monitoring parameters in devices. The present invention is especially useful in battery monitoring circuits for monitoring charge levels in battery devices.

By way of example and not by way of limitation, the present invention will be described in an exemplary embodiment of an apparatus and method for monitoring charge level in a battery device. The teachings of the present invention apply generally to any arrangement for monitoring a parameter in a host device where the parameter can be represented by an indicator signal, such as by an indicator voltage signal.

Presently available devices for monitoring charge level in a battery device (sometimes referred to as "gas gauges") are generally accurate for coulomb counting in carrying out battery monitoring operations. One important parameter that affects coulomb counting accuracy is the device input offset. Further, input offset may vary, or drift, with changes in temperature or applied supply power. In today's market smaller sizes of devices and lower operating voltages are increasingly prevalent with a result that sense elements in battery packs for sensing charge levels are smaller and power dissipation in portable electronic devices is reduced. These changes make accurate "gas gauging" or charge monitoring increasingly difficult, especially when the offset experienced by a monitoring circuit or apparatus is of the same order of magnitude as the standby voltage developed across the sense resistor used to generate a representative voltage for effecting charge monitoring. Challenges in accurate charge monitoring further increase when the monitoring apparatus offset drifts with temperature, or applied supply voltage, or another factor.

Prior art solutions for accommodating or allowing for offset cancellation have been based upon an offset value that is measured one time at a particular extant temperature and supply voltage. Such a static determination of offset at fixed temperature and supply voltage values for use throughout an operational period for a monitoring apparatus does not permit accurate accommodation for offset based upon realistic and up to date evaluations of currently extant conditions affecting offset as the host device and monitoring apparatus operate. Accordingly, offset values may approach levels that significantly exceed allowances made for the offset (based upon once-determined measurements) and thereby cause inaccuracies in indications by a monitoring circuit.

There is a need for an apparatus and method for determining offset cancellation that permits realistic accommodation of currently extant factors affecting offset over time.

SUMMARY OF THE INVENTION

An apparatus receives an indicating signal representing a parameter at a monitoring locus and includes: (a) A first measuring unit having a first input coupled for selectively receiving the indicating signal and presenting a first output signal that includes a first monitoring signal representing change in the indicating signal during a first time interval and a first benchmark signal indicating change imparted to signals by the first measuring unit. (b) A second measuring unit having a second input coupled for selectively receiving the indicating signal and presenting a second output signal that includes a second monitoring signal representing change in the indicating signal during a second time interval and a second benchmark signal indicating change imparted to signals by the second measuring unit. (c) An accumulating unit coupled for receiving and evaluating the first and second output signals and generating an accumulated signal that represents the evaluating. (d) An indicator unit coupled with the accumulating unit for receiving the indicator signal and presenting an indication relating to excursion of the indicating signal.

A method for measuring a parameter in a host device providing an indicating signal representative of the parameter at a signal monitoring locus includes the steps of: (a) in no particular order: (1) providing a first voltage measuring unit having a first input locus and a first output locus; (2) providing a second voltage measuring unit having a second input locus and a second output locus; (3) providing an accumulating unit coupled with the first output locus and the second output locus; the accumulating unit having at least one accumulated indicator output locus; and (4) providing an indicator unit coupled with the at least one accumulated indicator output locus. (b) Coupling the first input locus with the monitoring locus, and coupling the second input locus with ground during a first time interval. The first voltage measuring unit receives the indicating signal at the first input locus and presents a first monitoring signal at the first output locus. The second voltage measuring unit presents a second benchmark signal at the second output locus. The first monitoring signal represents change in the indicating signal during the first time interval. The second benchmark signal indicates changes imparted to signals by the second voltage measuring unit when traversing the second voltage measuring unit during the first time interval. (c) Coupling the second input locus with the monitoring locus, and coupling the first input locus with ground during a second time interval. The second voltage measuring unit receives the indicating signal at the second input locus and presents a second monitoring signal at the second output locus. The first voltage measuring unit presents a first benchmark signal at the first output locus. The second monitoring signal represents change in the indicating signal during the second time interval. The first benchmark signal indicates changes imparted to signals by the first voltage measuring unit when traversing the first voltage measuring unit during the second time interval. (d) Operating the accumulating unit to receive the first output signal and the second output signal, to evaluate the first output signal and the second output signal and to generate at least one accumulated indicator signal at the at least one accumulated indicator output locus. The at least one accumulated indicator signal represents the evaluating. (e) Operating the indicator unit to receive the at least one accumulated indicator signal and present an indication relating to excursion of the indicating signal.

It is, therefore, an object of the present invention to provide an apparatus and method for measuring a parameter in a host device that permits realistic accommodation of currently extant factors affecting offset to facilitate accurate determination of offset cancellation.

Further objects and features of the present invention will be apparent from the following specification and claims when considered in connection with the accompanying drawings, in which like elements are labeled using like reference numerals in the various figures, illustrating the preferred embodiments of the invention.

DETAILED DESCRIPTION OF THE PREFERRED EMBODIMENT

In a system in which the internal offset of a monitoring circuit or apparatus of the monitoring circuit drifts with temperature, or applied supply power or another environmental factor, a single offset calibration for compensating for the offset does not provide complete or accurate cancellation of the offset over an entire operational period between offset calibrations. As a consequence, significant errors may be introduced in monitoring results. The present invention provides an apparatus and method for effecting continuous dynamic measuring and cancellation offset in real time without a need for offset calibration.

Prior art offset calibration methods typically measure offset one time, and offset calibration is based upon the once-measured value. A problem results because the offset typically drifts over time as temperature and power supplied vary. Unacceptably large errors may result. The present invention uses two voltage measuring units, preferably embodied in voltage-to-frequency converters (VFC), to compensate for offset in real time without a need for offset calibration circuitry. A first VFC1 measures a parameter-indicating signal received from the device being monitored (i.e., the host device, such as a battery pack) during a first time interval $T_1$. During the same first time interval $T_1$ a second VFC2 is connected in a manner for measuring its own inherent offset. That is, second VFC2 is connected to measure the amount of offset it inherently imparts to signals traversing it. The outputs of the two VFCs are summed to subtract the inherent offset of VFC2 from the parameter-representing output from VFC1. After first time interval $T_1$ elapses, the two VFCs are interchanged in their roles for a second time interval $T_2$: VFC2 is coupled to measure a parameter-indicating signal from the device being monitored and VFC1 is connected in a manner for measuring its own inherent offset. This switching or interchanging of roles of VFC1 and VFC2 is carried out repetitively so that each of voltage-to-frequency converters VFC1, VFC2 are alternately producing a parameter-representing output or an output representing their own respective inherent offset. Preferably time intervals $T_1$, $T_2$ are equal and mutually exclusive. Time intervals $T_1$, $T_2$ may be advantageously selected for effecting the greatest efficiency in performing the desired parameter monitoring. This alternating employment of VFC1, VFC2 effects an automatic offset compensation, so there is no requirement for providing additional circuitry or computing capacity or software to determine offset cancellation. Savings in size, power consumption, cost of production and cost of maintenance (i.e., there is no device for offset compensation that ever needs repair or replacement) are therefore realized.

Figure 1:
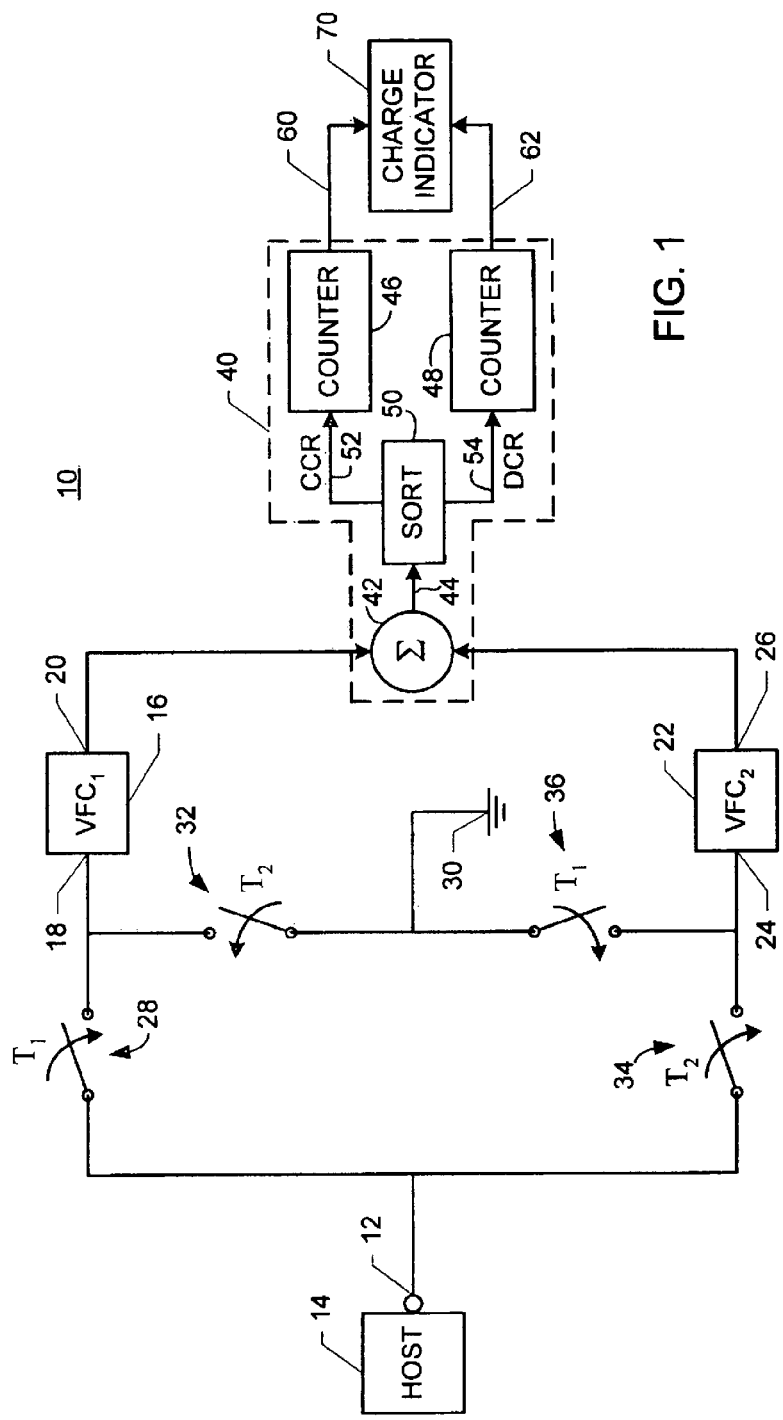
FIG. 1 is a schematic diagram of the preferred embodiment of the apparatus of the present invention.

FIG. 1 is a schematic diagram of the preferred embodiment of the apparatus of the present invention. In FIG. 1, an apparatus 10 is coupled with a monitoring locus 12 for measuring a parameter in a host device 14. The parameter measured is represented by an indicating signal appearing at monitoring locus 12. The indicating signal appearing at monitoring locus 12 is representative of the parameter to be measured. A first signal measuring unit 16 has a first input locus 18 and a first output locus 20. A second signal measuring unit 22 has a second input locus 24 and a second output locus 26. First input locus 18 is switchingly coupled with monitoring locus 12 by a switching unit 28 and is switchingly coupled with ground 30 by a switching unit 32. Second input locus 24 is switchingly coupled with monitoring locus 12 by a switching unit 34 and is switchingly coupled with ground 30 by a switching unit 36.

During a first time interval, switching units 28, 36 are closed and switching units 32, 34 are open to configure apparatus 10 in a first orientation. In such a first orientation, first input locus 18 is coupled with monitoring locus 12 and second input locus 24 is coupled with ground 30. In such a first orientation, a first output signal appearing at first output locus 20 is representative of the indicating signal appearing at monitoring locus 12, plus any offset that is imparted to the indicating signal by first signal measuring unit 16. The first output signal appearing at first output locus 20 may therefore be regarded as a first monitoring signal when apparatus 10 is in the first orientation. Further in such a first orientation, a second output signal appearing at second output locus 26 represents change or offset imparted to signals traversing second signal measuring unit 22. The second output signal appearing at second output locus 26 may therefore be regarded as a second benchmark or offset signal when apparatus 10 is in the first orientation.

During a second time interval, switching units 32, 34 are closed and switching units 28, 36 are open to configure apparatus 10 in a second orientation. In such a second orientation, second input locus 24 is coupled with monitoring locus 12 and first input locus 18 is coupled with ground 30. In such a second orientation, a first output signal appearing at first output locus 20 represents change or offset imparted to signals traversing first signal measuring unit 16. The first output signal appearing at first output locus 20 may therefore be regarded as a first benchmark or offset signal when apparatus 10 is in the second orientation. Further in such a second orientation, a second output signal appearing at second output locus 26 is representative of the indicating signal appearing at monitoring locus 12, plus any offset that is imparted to the indicating signal by second signal measuring unit 22. The second output signal appearing at second output locus 26 may therefore be regarded as a second monitoring signal when apparatus 10 is in the second orientation.

Output loci 20, 24 are coupled with an accumulating unit 40. Accumulating unit 40 receives first output signals appearing at first output locus 20 and receives second output signals appearing at second output locus 26. Accumulator unit 40 evaluates the output signals received from output loci 20, 26 and generates at least one indicator signal at accumulator outputs 60, 62. The at least one indicator signal is representative of the output signals received from output loci 20, 26.

An indicator unit 70 receives at least one indicator signal from accumulator unit 40 via accumulator outputs 60, 62 and employs the at least one indicator signal to present an indication relating to excursion of the indicating signal appearing at monitoring input locus 12.

Preferably, the first time interval during which apparatus 10 is in the first orientation and the second time interval during which apparatus 10 is in the second orientation are substantially equal and substantially mutually exclusive.

Accumulating unit 40 preferably includes a summer device 42 coupled for receiving first output signals appearing at first output locus 20 and receiving second output signals appearing at second output locus 26. Summer device 42 presents a summed aggregate signal representing the first output signal and second output signal at a summer output locus 44. Accumulator unit 40 further preferably includes at least one counter device. In FIG. 1 counter devices 46, 48 are coupled with summer output locus 44 via a sorting device 50. Sorting device 50 is configured to recognize when the summed aggregate signal appearing at summer output locus 44 is an increase-count indicator and when the summed aggregate signal appearing at summer output locus 44 is a decrease-count indicator. In the representative version of the invention embodied in a charge monitor circuit monitoring charge in a battery device (i.e., host device 12 is a battery device), for example, an increase-count indicator may be embodied in a charge count register (CCR) indicating an increase in charge, provided in FIG. 1 on a line 52 from sorting unit 50 to counter device 46. Further in the representative version of the invention embodied in a charge monitor circuit monitoring charge in a battery device, for example, a decrease-count indicator may be embodied in a discharge count register (DCR) indicating a decrease in charge, provided in FIG. 1 on a line 54 from sorting unit 50 to counter device 48.

Figure 2:
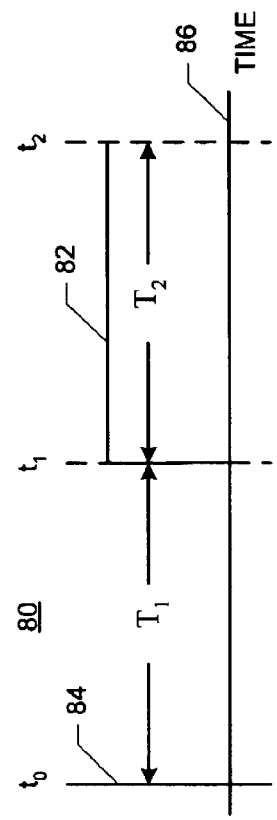
FIG. 2 is a timing diagram illustrating the preferred operation of the apparatus and method of the present invention.

FIG. 2 is a timing diagram illustrating the preferred operation of the apparatus and method of the present invention. In FIG. 2, a graphic plot 80 illustrates a signal 82 as signal 82 varies in amplitude measured against a vertical axis 84 as a function of time, measured on a horizontal axis 86. Signal 82 is exemplary of a timing signal that is varied appropriately to effect operation of apparatus 10 (FIG. 1) in the manner described above in connection with FIG. 1.

A first timing interval $T_1$ is established between a time $t_0$ and a time $t_1$. A second timing interval $T_2$ is established between time $t_1$ and a time $t_2$. Timing intervals $T_1$, $T_2$ are substantially equal in duration and are mutually exclusive. During timing interval $T_1$, switching units 28, 36 (FIG. 1) are closed and switching units 32, 34 (FIG. 1) are open. During timing interval $T_2$, switching units 28, 36 (FIG. 1) are open and switching units 32, 34 (FIG. 1) are closed. By providing that timing intervals $T_1$, $T_2$ are substantially equal in duration and are mutually exclusive, apparatus 10 (FIG. 1) is able to self correct for offsets that are associated with first signal measuring unit 16 and second signal measuring unit 22 over a period spanning timing intervals $T_1$, $T_2$.

Figure 3:
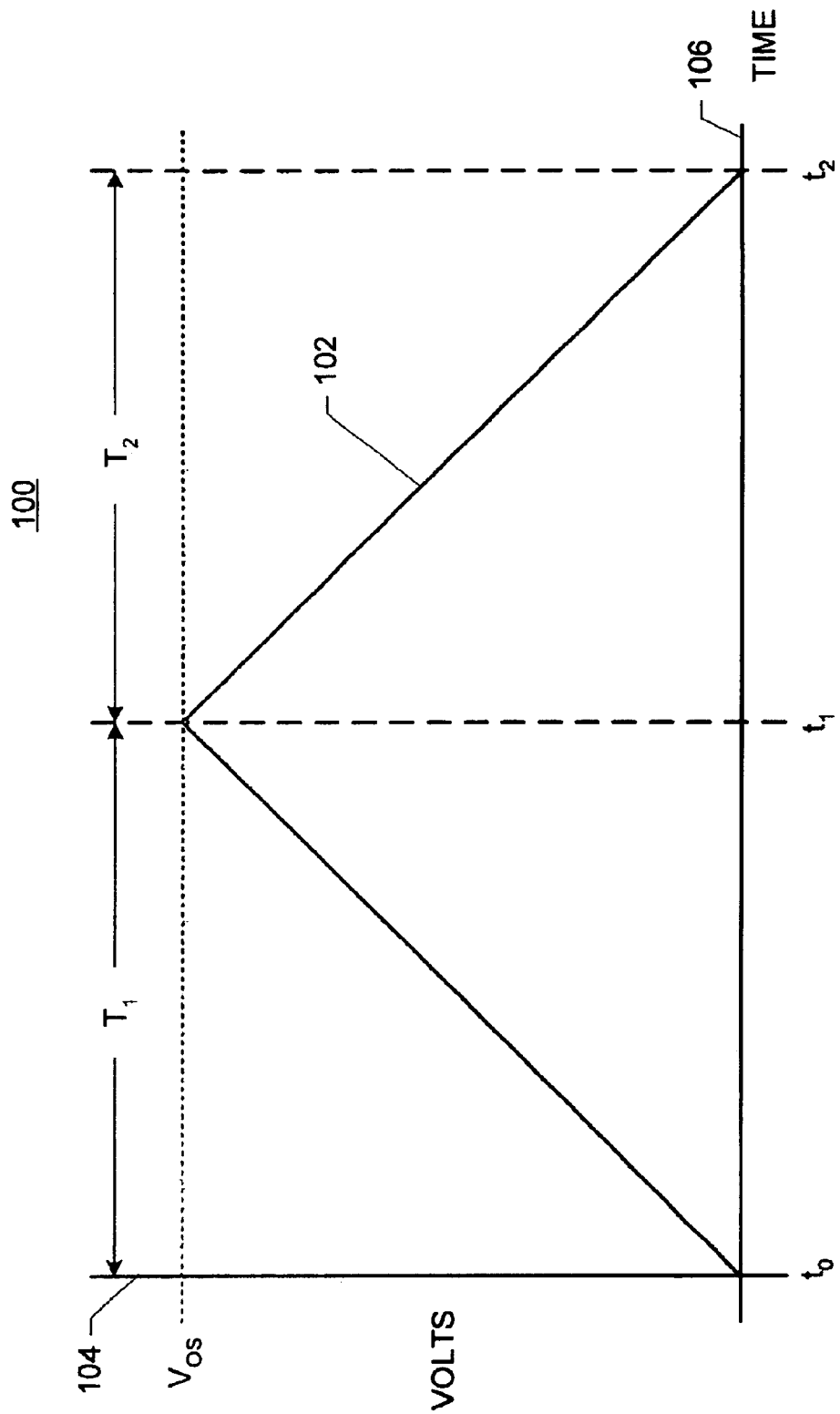
FIG. 3 is a schematic graphic representation of the offset experienced in the operation of the preferred embodiment of the apparatus and method of the present invention.

FIG. 3 is a schematic graphic representation of the offset experienced in the operation of the preferred embodiment of the apparatus and method of the present invention. In FIG. 3, a graphic plot 100 illustrates a measurement error or offset represented by a curve 102 as offset varies in amplitude measured against a vertical axis 104 (representing volts) as a function of time, measured on a horizontal axis 106. Curve 102 is exemplary of a measurement error or offset experienced by the summed aggregate output signal that is presented by summer device 42 at summer output locus 44 (FIG. 1). Thus, FIG. 3 illustrates the result of operating apparatus 10 (FIG. 1) according to the timing diagram illustrated in FIG. 2.

When apparatus 10 begins operation, a user does not need to take any action to calibrate apparatus 10 and perform offset compensation, as is required by existing prior art measuring apparatuses. Apparatus 10 automatically performs dynamic offset measurement and cancellation or compensation. Apparatus 10 begins operation, in this exemplary embodiment, at time $t_0$ (FIGS. 2 and 3) with switches 28, 36 closed and switches 32, 34 open (FIG. 1). In this first orientation, first signal measuring unit 16 presents a first output signal at first output locus 20 that is representative of the indicating signal appearing at monitoring locus 12, plus any offset that is imparted to the indicating signal by first signal measuring unit 16. Also in this a first orientation, second signal measuring unit 22 presents a first output signal at second output locus 26 is representative of the offset that is imparted to the indicating signal by second signal measuring unit 22. Summer device 42 sums the output signals from output loci 20, 26 to present a summed aggregate output signal at summer output locus 44. Stated mathematically, the summed aggregate output signal at summer output locus 44 during time interval $T_1$ is:

$$V_{OUT1} = V_{SIG1} + V_{OS1} + V_{OS2} \qquad [1]$$

where $V_{OUT1}$ is the integrated first output signal at output locus 20 during interval $T_1$, $V_{SIG1}$ is the integrated indicating signal at monitoring locus 12 during interval $T_1$, $V_{OS1}$ is the integrated offset imparted by signal measuring unit 16 during interval $T_1$ and $V_{OS2}$ is the integrated offset imparted by signal measuring unit 22 during interval $T_1$.

During time interval T2, summer device 42 sums the output signals from output loci 20, 26 to present a summed aggregate output signal at summer output locus 44 that may be stated mathematically as:

$$V_{OUT2} = V_{SIG2} + V_{OS2} - V_{OS1} \qquad [2]$$

where $V_{OUT2}$ is the integrated second output signal at output locus 26 during interval $T_1$, $V_{SIG2}$ is the integrated indicating signal at monitoring locus 12 during interval $T_2$, $V_{OS2}$ is the integrated offset imparted by signal measuring unit 22 during interval $T_2$ and $V_{OS1}$ is the integrated offset imparted by signal measuring unit 16.

Combining the results of expressions [1] and [2] for a period of 2T (i.e., over the time interval $t_0$–$t_2$; FIGS. 2 and 3), one obtains:

$$V_{TOTAL} = V_{SIG1} + V_{SIG2} \qquad [3]$$

It is worth noting that expression [3] is independent of offset values $V_{OS1}$, $V_{OS2}$. Measurement error (i.e., offset) varies over time and exhibits a maximum at odd multiples of T and minimums (i.e., zero) at even multiples of T. This variance of measurement error or offset over time is illustrated in FIG. 3. Thus, curve 102 represents measurement error or offset in apparatus 10 (FIG. 1) when apparatus 10 is operated according to the timing arrangement illustrated in FIG. 2. As illustrated in FIG. 3, offset begins at time to with a minimum value at zero volts. Offset or measurement error accumulates over time throughout timing interval $T_1$, from time $t_0$ until time $t_1$, to a maximum value of $V_{os}$ as indicated according to expression [1]. At time $t_1$ first timing interval $T_1$ ends and second timing interval $T_2$ begins.

Offset begins at time $t_1$ at a maximum value of $V_{OS}$ and declines over time throughout timing interval $T_2$, from time $t_1$ until time $t_2$, to a minimum value of zero as indicated according to expression [2]. The return of curve 102 to a zero value at time $t_2$ presumes that signal measuring units 16, 22 impart substantially equal offsets to signals traversing them. At time $t_2$ a new first timing interval $T_1$ begins. In such manner, measurement error or offset self-cancels over time with no necessity for calibration hardware or imposition of offset cancellation. The offset cancellation occurs automatically in real time by performing the described summation in the digital domain.

Figure 4:
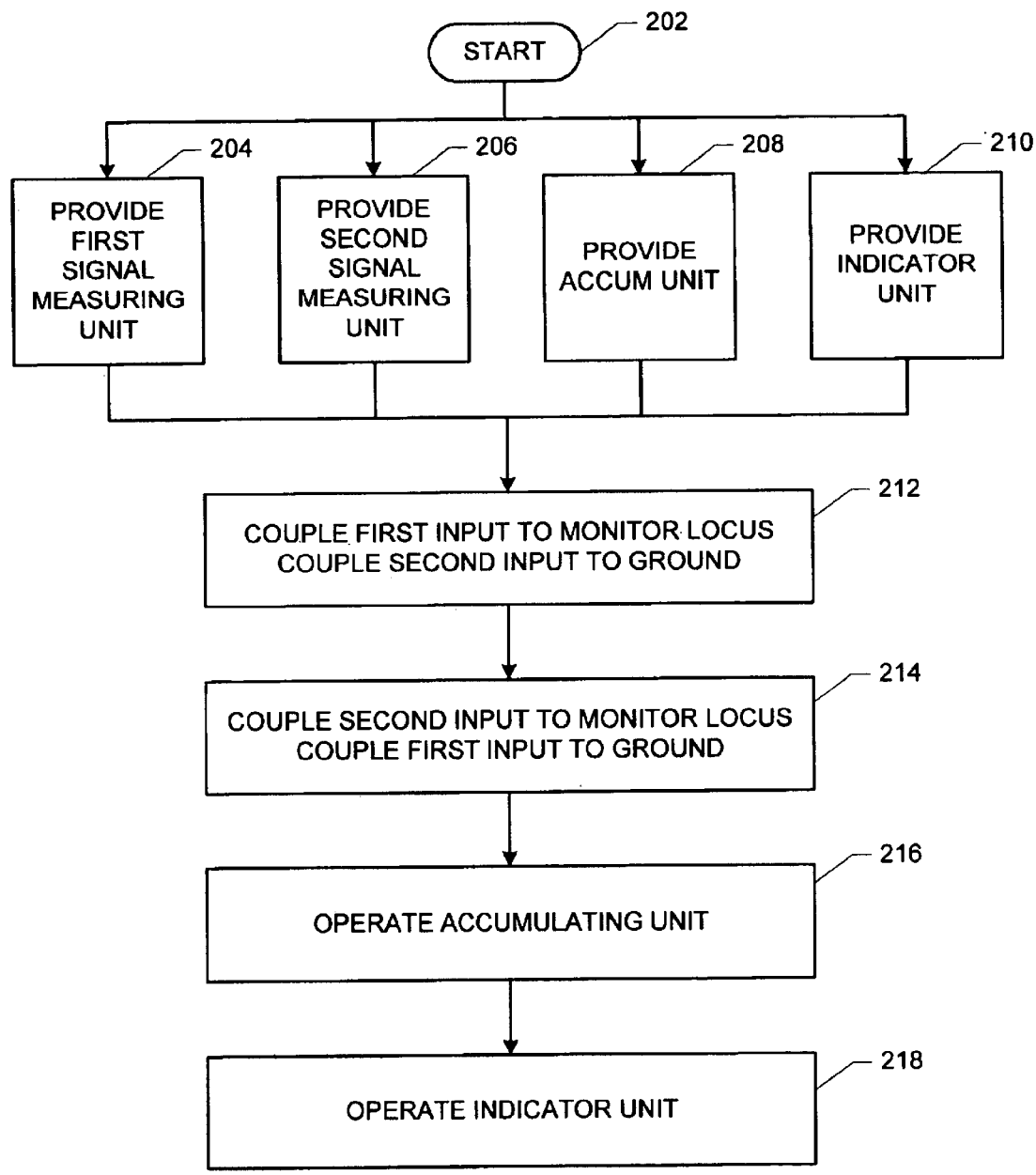
FIG. 4 is a flow chart illustrating the preferred embodiment of the method of the present invention.

FIG. 4 is a flow chart illustrating the preferred embodiment of the method of the present invention. In FIG. 4, a method 200 for measuring a parameter in a host device providing an indicating signal representative of the parameter at a signal monitoring locus begins at a START locus 202. Method 200 continues from START locus 202 to, in no particular order: (1) Provide a first signal measuring unit, as indicated by a block 204. The first signal measuring unit has a first input locus and a first output locus. (2) Provide a second signal measuring unit, as indicated by a block 206. The second signal measuring unit has a second input locus and a second output locus. (3) Provide an accumulating unit, as indicated by a block 208. The accumulating unit is coupled with the first output locus and the second output locus and has at least one accumulated indicator output locus. (4) Provide an indicator unit, as indicated by a block 210. The indicator unit is coupled with the at least one accumulated indicator output locus.

Method 100 continues with coupling the first input locus with the monitoring locus, and coupling the second input locus with ground during a first time interval, as indicated by a block 212. The first voltage measuring unit receives the indicating signal at the first input locus and presents a first monitoring signal at the first output locus. The second voltage measuring unit presents a second benchmark signal at the second output locus. The first monitoring signal represents change in the indicating signal during the first time interval. The second benchmark signal indicates changes imparted to signals by the second signal measuring unit when traversing the second signal measuring unit during the first time interval.

Method 100 continues with coupling the second input locus with the monitoring locus, and coupling the first input locus with ground during a second time interval, as indicated by a block 214. The second signal measuring unit receives the indicating signal at the second input locus and presents a second monitoring signal at the second output locus. The first signal measuring unit presents a first benchmark signal at the first output locus. The second monitoring signal represents change in the indicating signal during the second time interval. The first benchmark signal indicates changes imparted to signals by the first signal measuring unit when traversing the first signal measuring unit during the second time interval.

Method 100 continues with the step of operating the accumulating unit, as indicated by a block 216. The accumulating unit receives the first output signal and the second output signal, evaluates the first output signal and the second output signal and generates at least one accumulated indicator signal at the at least one accumulated indicator output locus. The at least one accumulated indicator signal represents the evaluating.

Method 100 continues with operating the indicator unit, as indicated by a block 218. The indicator unit receives the at least one accumulated indicator signal and presents an indication relating to excursion of the indicating signal.

It is to be understood that, while the detailed drawings and specific examples given describe preferred embodiments of the invention, they are for the purpose of illustration only, that the apparatus and method of the invention are not limited to the precise details and conditions disclosed and that various changes may be made therein without departing from the spirit of the invention which is defined by the following claims:

I claim:

1. An apparatus for measuring a parameter in a host device; the apparatus receiving an indicating signal from said host device at a signal monitoring locus; said indicating signal being representative of said parameter; the apparatus comprising:

(a) a first signal measuring unit having a first input locus and a first output locus; said first input locus being selectively coupled with said monitoring locus; said first signal measuring unit selectively receiving said indicating signal at said first input locus and presenting a first output signal at said first output locus; said first output signal including a first monitoring signal and a first benchmark signal; said first monitoring signal representing change in said indicating signal during a first time interval; said first benchmark signal indicating change imparted to signals by said first signal measuring unit when traversing said first signal measuring unit during a second time interval;

(b) a second signal measuring unit having a second input locus and a second output locus; said second input locus being selectively coupled with said monitoring locus; said second signal measuring unit selectively receiving said indicating signal at said second input locus and presenting a second output signal at said second output locus; said second output signal including a second monitoring signal and a second benchmark signal; said second monitoring signal representing change in said indicating signal during said second time interval; said second benchmark signal indicating change imparted to signals by said second signal measuring unit when traversing said second signal measuring unit during said first time interval;

(c) an accumulating unit coupled with said first output locus and said second output locus; said accumulating unit receiving said first output signal and said second output signal; said accumulating unit evaluating said first output signal and said second output signal and generating at least one accumulated indicator signal at at least one accumulated indicator output locus; said at least one accumulat d indicator signal representing said evaluating; and (d) an indicator unit coupled with said at least one accumulated indicator output locus; said indicator unit rec iving said at least one accumulated indicator signal and presenting an indication relating to excursion of said indicating signal.

2. An apparatus for measuring a parameter in a host device as recited in claim 1 wherein said first time interval and said second time interval are mutually exclusive time intervals.

3. An apparatus for measuring a parameter in a host device as recited in claim 1 wherein said first signal measuring unit and said second signal measuring unit are each embodied in a voltage-to-frequency converter device.

4. An apparatus for measuring a parameter in a host device as recited in claim 1 wherein said first monitoring signal represents an integral of change of said indicating signal with respect to time over said first time interval, and wherein said second monitoring signal represents an integral of change of said indicating signal with respect to time over said second time interval.

5. An apparatus for measuring a parameter in a host device as recited in claim 1 wherein said host device is a battery device and wherein said parameter is charge in said battery device.

6. An apparatus for measuring a parameter in a host device as recited in claim 5 wherein said first monitoring signal represents an integral of change of said indicating signal with respect to time over said first time interval, and wherein said second monitoring signal represents an integral of change of said indicating signal with respect to time over said second time interval.

7. An apparatus for measuring a parameter in a host device as recited in claim 6 wherein said first time interval and said second time interval are mutually exclusive time intervals.

8. An apparatus for measuring a parameter in a host device as recited in claim 7 wherein said first signal measuring unit and said second signal measuring unit are each embodied in a voltage-to-frequency converter device.

9. An apparatus for measuring a parameter in a host device as recited in claim 1 wherein said accumulating unit comprises:

(1) a summer device for receiving said first output signal and said second output signal and presenting a summed aggregate signal representing a sum of said first output signal and said second output signal at a summer output locus; and (2) a counter device coupled with said summer output locus; said counter device responding to said summed aggregate signal to generate said at least one accumulated indicator output.

10. An apparatus for measuring a parameter in a host device as recited in claim 9 wherein said counter device is an up-counter device and a down-counter device; said up-counter device and said down-counter device cooperating to generate an up-excursion accumulated indicator signal at an up-excursion indicator output locus and generate a down-excursion accumulated indicator signal at a down-excursion indicator output locus; said indicator unit being coupled with said up-excursion indicator output locus and with said down-excursion indicator output locus.

11. An apparatus for measuring a parameter in a host device as recited in claim 10 wherein said first monitoring signal represents an integral of change of said indicating signal with respect to time over said first time interval, and wherein said second monitoring signal represents an integral of change of said indicating signal with respect to time over said second tim interval.

12. An apparatus for measuring a parameter in a host device as recited in claim 11 wherein said first signal measuring unit and said second signal measuring unit are each embodied in a voltage-to-frequency converter device.

13. An apparatus for measuring a parameter in a host device as recited in claim 12 wherein said first time interval and said second time interval are mutually exclusive time intervals.

14. An apparatus for monitoring charge in a battery device; the apparatus receiving a charge indicating signal from said battery device at a signal monitoring locus; said charge indicating signal being representative of said charge; the apparatus comprising:

(a) a first signal measuring unit having a first input locus and a first output locus; said first input locus being coupled with said monitoring locus during a first time interval and coupled with ground during a second time interval; said first signal measuring unit presenting a first output signal at said first output locus; said first output signal including a first monitoring signal and a first benchmark signal; said first monitoring signal representing change in said charge indicating signal during said first time interval; said first benchmark signal indicating change imparted to signals by said first signal measuring unit when traversing said first signal measuring unit during said second time interval;

(b) a second signal measuring unit having a second input locus and a second output locus; said second input locus being coupled with said monitoring locus during said second time interval and coupled with ground during said first time interval; said second signal measuring unit presenting a second output signal at said second output locus; said second output signal including a second monitoring signal and a second benchmark signal: said second monitoring signal representing change in said indicating signal during said second time interval; said second benchmark signal indicating change imparted to signals by said second signal measuring unit when traversing said second signal measuring unit during said first time interval;

(c) an accumulating unit coupled with said first output locus and said second output locus; said accumulating unit receiving said first output signal and said second output signal; said accumulating unit evaluating said first output signal and said second output signal and generating at least one accumulated indicator signal at at least one accumulated indicator output locus; said at least one accumulated indicator signal representing said evaluating; and (d) an indicator unit coupled with said at least one accumulated indicator output locus; said indicator unit receiving said at least one accumulated indicator signal and presenting an indication relating to excursion or said indicating signal.

15. An apparatus for measuring a parameter in a host device as recited in claim 14 wherein said first signal measuring unit and said second signal measuring unit are each embodied in a voltage-to-frequency converter device.

16. An apparatus for measuring a parameter in a host device as recited in claim 15 wherein said first monitoring signal represents an integral of change of said indicating signal with respect to time over said first time interval, and wherein said second monitoring signal represents an integral of change of said indicating signal with respect to time over said second time interval.

17. An apparatus for measuring a parameter in a host device as recited in claim 16 wherein said accumulating unit comprises:

(1) a summer device for receiving said first output signal and said second output signal and presenting a summed aggregate signal representing a sum of said first output signal and said second output signal at a summer output locus; and (2) a counter device coupled with said summer output locus; said counter device responding to said summed aggregate signal to generate said at least one accumulated indicator output.

18. An apparatus for measuring a parameter in a host device as recited in claim 17 wherein said counter device is an up-counter device and a down-counter device; said up-counter device and said down-counter device cooperating to generate an up-excursion accumulated indicator signal at an up-excursion indicator output locus and generate a down-excursion accumulated indicator signal at a down-excursion indicator output locus; said indicator unit being coupled with said up-excursion indicator output locus and with said down-excursion indicator output locus.

19. A method for measuring a parameter in a host device; said host device providing an indicating signal at a signal monitoring locus; said indicating signal being representative of said parameter the method comprising the steps of:

(a) in no particular order:
  (1) providing a first signal measuring unit having a first input locus and a first output locus;
  (2) providing a second signal measuring unit having a second input locus and a second output locus;
  (3) providing an accumulating unit coupled with said first output locus and said second output locus; said accumulating unit having at least one accumulated indicator output locus; and
  (4) providing an indicator unit coupled with said at least one accumulated indicator output locus;

(b) coupling said first input locus with said monitoring locus, and coupling said second input locus with ground during a first time interval; said first voltage measuring unit receiving said indicating signal at said first input locus and presenting a first monitoring signal at said first output locus; said second voltage measuring unit presenting a second benchmark signal at said second output locus; said first monitoring signal representing change in said indicating signal during said first time interval; said second benchmark signal indicating changes imparted to signals by said second signal measuring unit when traversing said second signal measuring unit during said first time interval;

(c) coupling said second input locus with said monitoring locus, and coupling said first input locus with ground during a second time interval; said second signal measuring unit receiving said indicating signal at said second input locus and presenting a second monitoring signal at said second output locus; said first signal measuring unit presenting a first benchmark signal at said first output locus; said second monitoring signal representing change in said indicating signal during said second time interval; said first benchmark signal indicating changes imparted to signals by said first signal measuring unit when traversing said first signal measuring unit during said second time interval; said accumulating unit receiving said first output signal and said second output signal;

(d) operating said accumulating unit to receive said first output signal and said second output signal, to evaluate said first output signal and said second output signal and to generate at least one accumulated indicator signal at said at least one accumulated Indicator output locus; said at least one accumulated indicator signal representing said evaluating; and (e) operating said indicator unit to receive said at least one accumulated indicator signal and present an indication relating to excursion of said indicating signal.

20. An method for measuring a parameter in a host device as recited in claim 19 wherein said accumulating unit comprises:

(1) a summer device for receiving said first output signal and said second output signal and presenting a summed aggregate signal representing a sum of said first output signal and said second output signal at a summer output locus; and (2) a counter device coupled with said summer output locus; said counter device responding to said summed aggregate signal to generate said at least one accumulated indicator output.

* * * * *